United States Patent [19]

Norton et al.

[11] Patent Number: 4,629,278
[45] Date of Patent: Dec. 16, 1986

[54] SURFACE MOUNTABLE CONNECTOR RETENTION MEANS AND METHOD

[75] Inventors: Jeffrey M. Norton, Loysville; Shoji Yamada, Harrisburg, both of Pa.

[73] Assignee: AMP Incorporated, Harrisburg, Pa.

[21] Appl. No.: 723,241

[22] Filed: Apr. 15, 1985

[51] Int. Cl.⁴ .............................................. H01R 9/09
[52] U.S. Cl. ................................ 339/134; 339/17 LC; 29/842
[58] Field of Search .................. 339/125, 126 R, 128, 339/132, 134, 17 L, 17 LC, 17 LM; 29/842, 843

[56] References Cited

U.S. PATENT DOCUMENTS

| | | | |
|---|---|---|---|
| 2,869,098 | 1/1959 | Sauer | 339/128 X |
| 4,009,921 | 3/1977 | Narozny | 339/99 R |
| 4,087,148 | 5/1978 | Baüerle | 339/17 LC X |
| 4,550,959 | 11/1985 | Grabbe et al. | 339/17 LM X |

Primary Examiner—Eugene F. Desmond
Attorney, Agent, or Firm—Anton P. Ness

[57] ABSTRACT

A pair of retention clips are disposed around end flanges of a connector to be mounted to a printed circuit board and have board-proximate surface sections which are firmly secured to the board surface to hold the connector firmly to the board without screws, rivets or the like. The clips allow limited axial expansion and contraction of the connector during significant changes in temperature by securely engaging the flanges. Where the retention clips are metal, the securing method could involve vapor phase reflow soldering which also solders the terminals to the conductors on the board surface. Where the retention clips are plastic, the securing method could involve actinic radiation curing of adhesive material. Retention clips also can secure an edge connector to an edge of a board.

34 Claims, 13 Drawing Figures

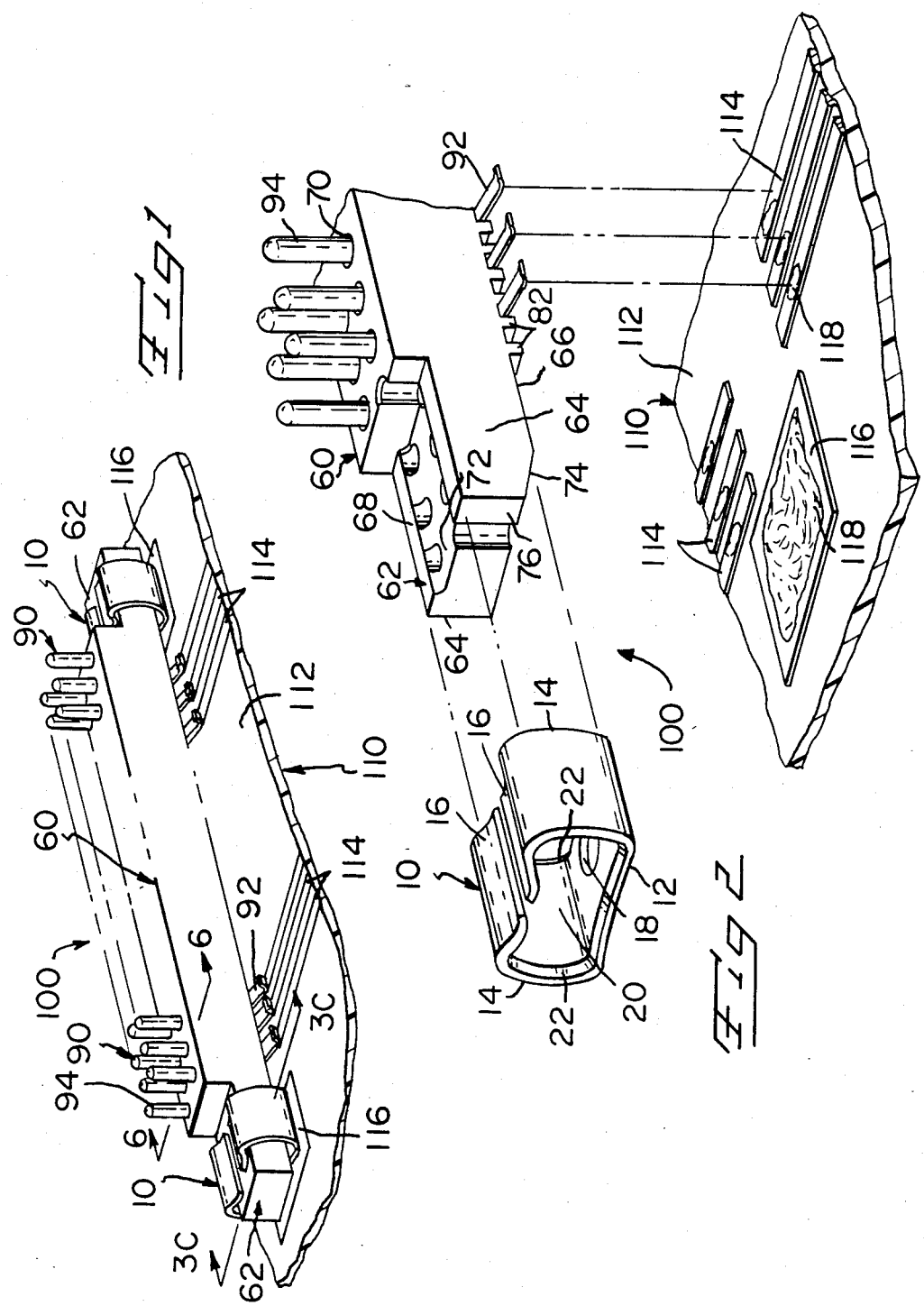

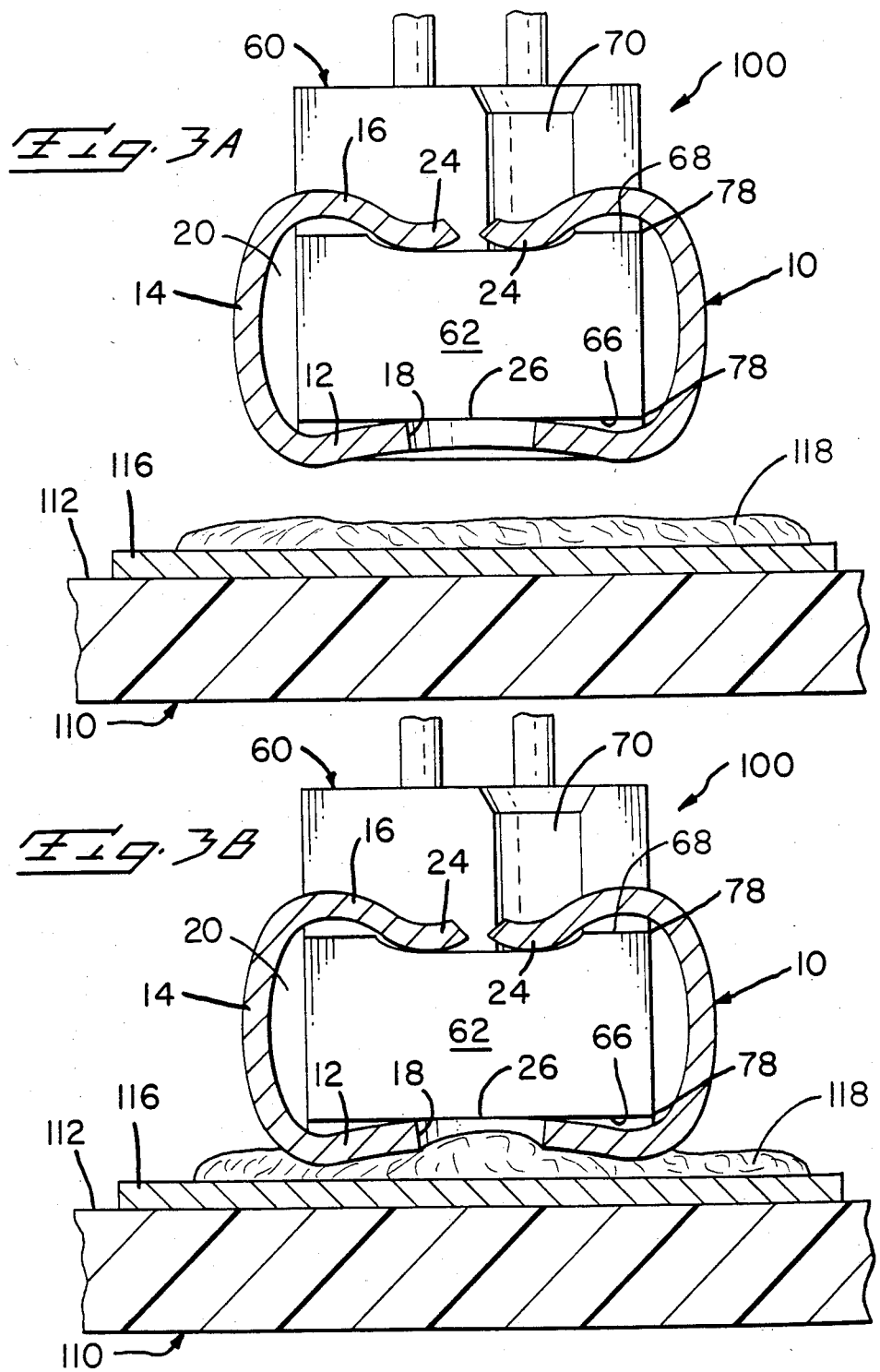

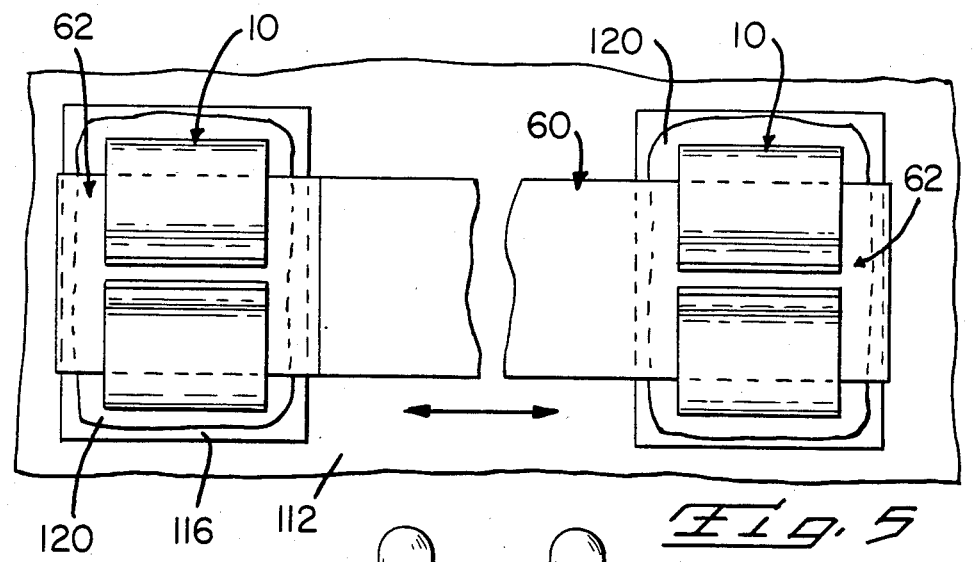
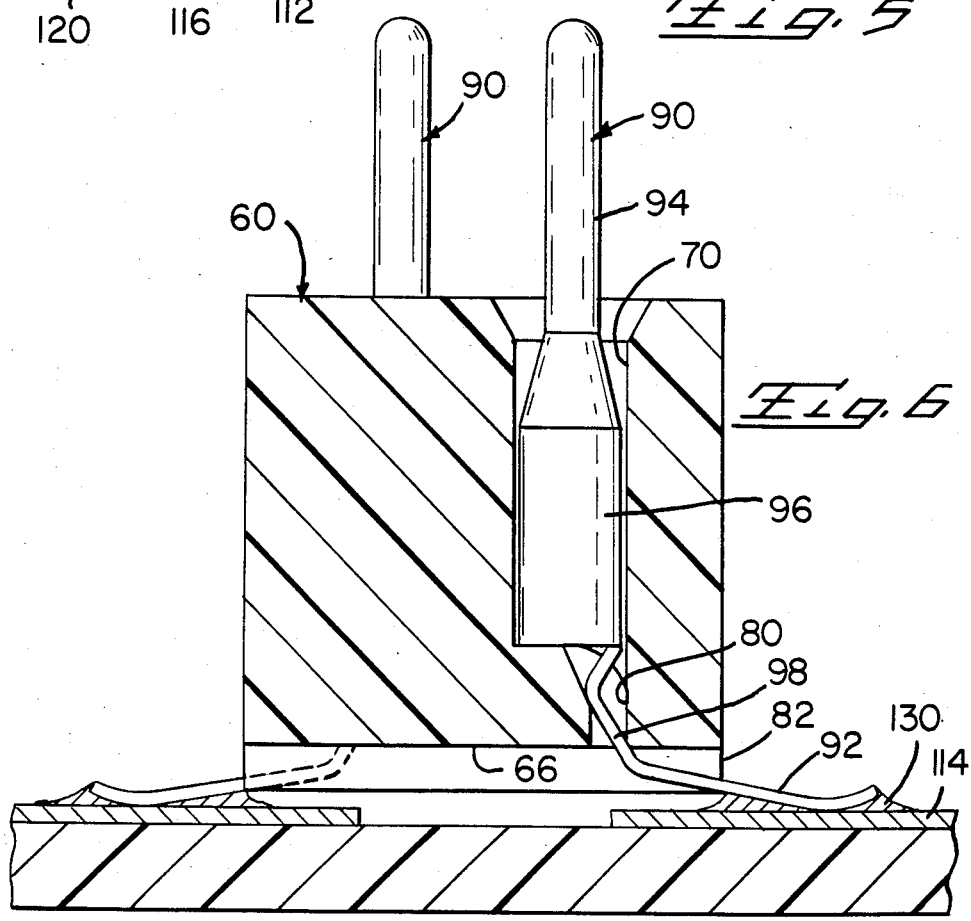

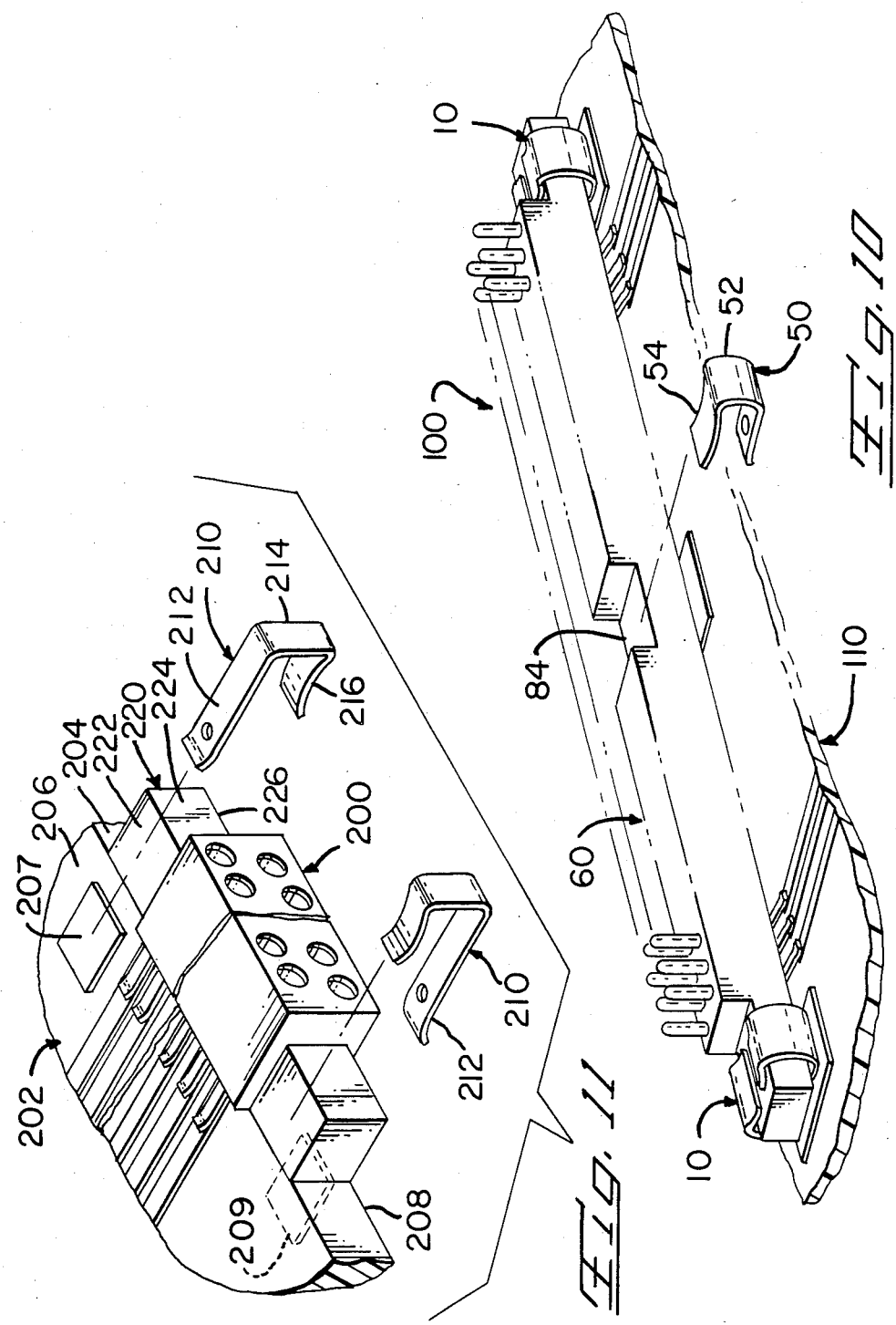

SURFACE MOUNTABLE CONNECTOR RETENTION MEANS AND METHOD

FIELD OF THE INVENTION

This relates to the field of electrical connectors and more particularly to connectors for printed circuit boards.

BACKGROUND OF THE INVENTION

Electrical connectors for printed circuit boards typically have a plurality of contact terminals therein to electrically engage respective electrical conductors along the surface of the board. Such electrical engagement is most commonly made by one of two methods: the terminals may have pin portions extending outward from the connector to be inserted into and through plated through-holes of the board where plating material on inside walls of the holes makes electrical connection to conductors on the board surface; or, the terminals may have leg portions extending substantially parallel to the board surface along and against the conductors on the board surface. In both cases the electrical engagement is commonly assured by soldering the electrical connection of the pin portions to the board conductors or plating material, or the leg portions to the board conductors.

In either method of making the electrical connection, the electrical connector is mechanically secured to the printed circuit board by means of clamping screws extending through holes drilled through the board and bolted on the opposing surface, such as is disclosed in U.S. Pat. No. 4,087,146, by rivets as disclosed in U.S. Pat. No. 4,401,355, by brackets such as disclosed in U.S. patent application Ser. No. 683,538 having pins which wedge in such drilled holes and may be soldered, or by latching mounting legs as disclosed in U.S. Pat. No. 4,439,000. The electrical connector may be held to the board by a separate shroud which is secured to the board in the manner just described, or in a manner such as is disclosed in U.S. Pat. No. 4,173,387.

It is also known that an electrical connector secured firmly to a board by such means and whose terminals have leg portions to engage surface conductors, need not necessarily require soldering of the terminal leg portions to the conductors but instead rely on the connector securing means to hold the connector and its terminal leg portions firmly against the conductors with the leg portions being spring-biased against the respective conductors, as in U.S. Pat. No. 4,087,146.

The drive toward surface mount technology reflects the desire to miniaturize electrical devices, components, and connectors and the board to which they are mounted. Eliminating plated through-holes enabled much closer spacing of terminals in a connector, and therefore, smaller connectors. Electrical components having, for instance, only a relatively few leads can be adequately secured to the surface simply by soldering. Such a component is not subjected to the mating and unmating forces of a multiterminal connector with a mating connector. But a connector would have to be secured by means other than only soldering its terminals to board conductors to withstand such forces.

During soldering of a connector to a board where significant heat is applied, and also during in-service functioning of such a printed circuit board having a connector secured thereto where in-service temperatures may achieve significant levels such as 125 degrees Celsius, the rate of temperature rise and fall may typically be rapid. A connector made of a certain dielectric material with a specific structure and mass distribution has a certain first coefficient of thermal expansion, and the printed circuit board of a certain material and different, planar structure has a certain second coefficient of thermal expansion usually substantially different from that of the connector. With significant amounts and rapid rates of temperature changes, the differences in such coefficients of thermal expansion result in expansion and contraction of the connector and the board relative to each other, or such differences result at least in stresses thereon.

It is therefore desirable to provide a means for securing an electrical connector to a printed circuit board which allows for expansion and contraction of a connector relative to the board, and which does not impose significant stress on the soldered electrical connections of terminals to board conductors as a result of such expansion and contraction.

It is also desirable to provide a means for securing a connector to a board which resists the mating and unmating forces of another connector being mated and unmated with the connector secured to the board.

It is further desirable to provide a relatively simple and economical method of securing a connector to a board which eliminates the need for holes to be drilled or formed in the board.

It is additionally desirable to provide a securing method which can be performed simultaneously with the terminal soldering operation and also using the same materials.

SUMMARY OF THE INVENTION

The present invention comprises a retention clip engaged on a longitudinal flange or ear of a connector, and preferably a pair of such clips on both ends of a connector, which clips have a surface section proximate the surface of the printed circuit board to which the connector is being secured, firmly securable to the board such as by conventional vapor phase reflow soldering techniques. One type of metal clip has sides extending upward from the board-proximate surface section and arms extending inward from the sides to reach over the flange of the connector. The clip is placed on the flange by spring-biasing the arms and is not tightly secured to the connector but can allow slight longitudinal or axial movement of the connector relative to the retention clip. A hole through the board-proximate surface allows the finally soldered connection to be filleted thereat to form a better solder joint. The clip arms can be slightly downwardly directed in their unbiased state, and the inward edges of the clip can be chamfered to assist in placement on the connector. The clip can also be continuous around the flange by being formed from a tubular sleeve and having opposing arcuate concave sides, or top and bottom sections, to engage the connector flange under spring bias.

Another embodiment of retention clip can be U-shaped with a single long arm for sideways insertion onto a long connector intermediate the ends thereof, to be soldered to the board and firmly hold the connector against the board. Still another embodiment of clip can be used to secure an edge connector to an edge portion of a printed circuit board.

Use of such metal clips soldered to the board allows expansion and contraction along the longitudinal axis of the connector during heating and cooling during in-service use and during soldering. The soldering of the clips can be performed simultaneously with the reflow soldering of the terminal leg portions of the connector to their respective board conductors. The method of securing the connector to the board requires no holes through the board and no extra steps such as assembling with screws or bolts or rivets, and is capable of robotic application. In another embodiment of retention clip of the invention, a plastic clip having a continuous sleeve-like wall and a solid board-proximate surface may be firmly secured to a nonmetallic board surface portion by high-strength, heat-resistant adhesive instead of solder. Such a plastic clip would be made of high-strength heat-resistant plastic. If the connector terminals need not be soldered, the connector assembly could be secured to the board after all vapor phase reflow soldering of all other components of the board has been performed.

BRIEF DESCRIPTION OF THE DRAWINGS

FIG. 1 is a perspective view of a connector mounted to a board surface using the retention clips of the present invention.

FIG. 2 is a part perspective view of an end of a connector with a clip exploded therefrom to be mounted on a board surface.

FIGS. 3A to 3C are cross-sectional views illustrating a connector end with a clip thereon prior to mounting, during positioning, and after soldering to a board respectively.

FIG. 5 is a diagram illustrating the expansion and contraction of a connector through soldered clips.

FIG. 6 is a cross-sectional view through a terminal cavity after the soldering process through lines 6—6 of FIG. 1.

FIG. 10 is a perspective view of a long connector mounted to a board with a clip for use in the middle thereof.

FIG. 11 illustrates an embodiment of retention clips useful to secure an edge connector to a board edge.

DETAILED DESCRIPTION OF THE PREFERRED EMBODIMENT

Figure 3C:
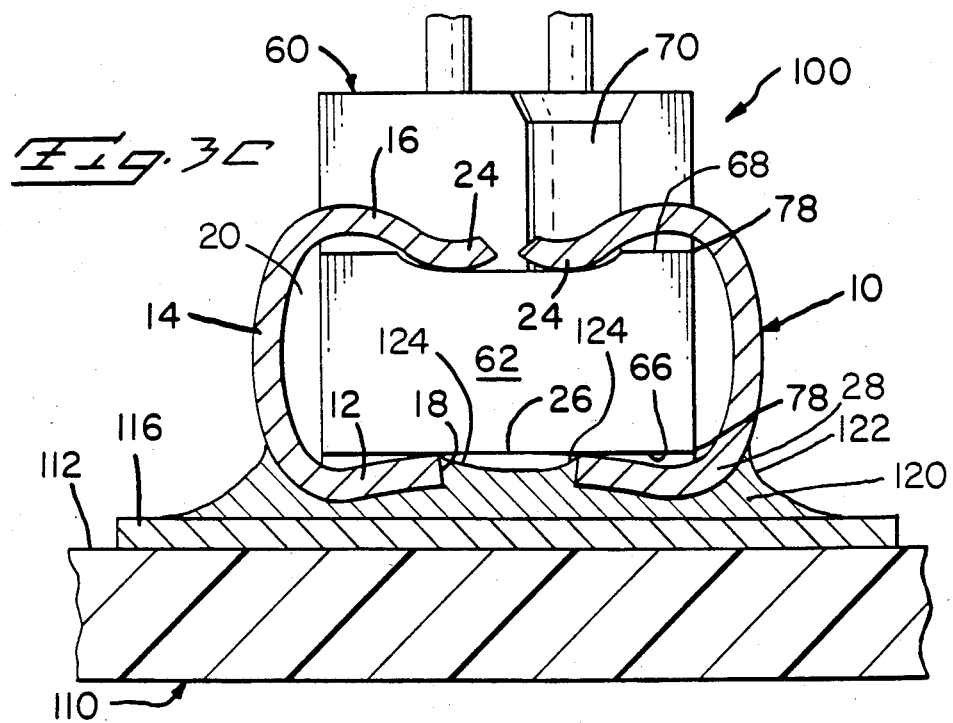

FIG. 1 illustrates a connector assembly 100 mounted to a surface 112 of a printed circuit board 110 having electrical conductors 114 along surface 112. Retention clips 10 are mounted around flanges 62 of dielectric connector housing 60 and are soldered to board 110 at metal surface portions 116. Pin terminals 90 have leg portions 92 electrically engaging conductors 114 and pin contact sections 94 extending upwardly from connector assembly 100 for mating engagement with a mating connector (not shown) having corresponding socket terminals therein.

FIG. 2 shows a preferred embodiment of retention clip 10 of the invention about to be mounted on flange 62 of housing 60, whereafter the connector assembly 100 will then be positioned on surface 112 of board 110 to undergo a soldering operation such as vapor phase reflow soldering which is preferred. Board surface portion 116 has solder paste 118 thereon; portions of conductors 114 also have solder paste 118 thereon for soldering of terminal leg portions 92 thereto.

Retention clip 10 has a board-proximate surface or bottom section 12, side sections 14 and arm sections 16 extending inwardly from side sections 14 and opposed from bottom section 12 forming a flange-receiving channel 20. Clip 10 is preferred to be stamped and formed from metal having spring characteristics and is either solderable using tin-lead solder paste or is tin-plated to be solderable. Such metal could be tin-lead-plated beryllium copper. Clip 10 is placed on housing 60 by having flange 62 extend through flange-receiving channel 20 such that side sections 14 are disposed along sides 64 of flange 62, bottom clip section 12 is below flange 62 along and against its bottom surface 66, and arm sections 16 extend over the top surface 68 of flange 62. Clip 10 thus extends radially around flange 62. Arm sections 16 extend downwardly in their unbiased condition and are biased upwardly by top flange surface 68 to hold clip 10 onto flange 62 by spring force. Inside edges 22 of clip 10 are preferred to be chamfered at both ends of clip 10 to assist in placing the clip onto the flange, and the chamfers can be swedged in the metal blank prior to forming the clip in a conventional stamping and forming operation.

Flange 62 can be formed when housing 60 is molded from conventional thermoplastic material into its final shape. Flange 62 can also be formed by cutting or milling an end of a housing cut to a selected length from a long continuous molded housing strip, such as one shown having two rows of alternating terminal-receiving cavities 70 spaced at 0.050 inch centerlines, in which case the cavities 70 in the flange portion would not receive terminals therein. Flange 62 may have a shallow groove 72 formed in top surface 68 therealong to assist clip arm sections 16 to secure to flange 62. Flange 62 may also have a beveled surface 74 formed on bottom surface 66 inwardly from end 76 thereof to assist in placing clip 10 thereon.

FIGS. 3A, 3B and 3C illustrate one method of mounting a connector assembly 100 having clips 10 thereon, to a board 110. In FIG. 3A, clip 10 engages flange 62 primarily with ends 24 of arm sections 16 against top flange surface 68, and substantially at the center 26 of bottom clip section 12 which preferably arcs slightly upwardly against flange bottom surface 66 when clip 10 is under spring loading. Engagement may also occur at corner edges 78 of flange 62 without substantially adversely affecting the usefulness of the invention. Clip 10 is preferably formed such that the height of channel 20 is less than the height of flange 62 when clip 10 is unstressed, between the inside surfaces of arm ends 24 and the inside surface of bottom section 12.

In FIG. 3B, connector assembly 100 has been positioned on board 110, with bottom clip section 12 pushed into solder paste 118 so that paste 118 engages the entire bottom surface of section 12 and with some paste 118 being mounded in the center and into hole 18. It is preferred that solder paste 118 be spread over an area of metal board portion 116 substantially beyond the outer reaches of bottom clip section 12 when placed thereonto.

In FIG. 3C, the positioned connector assembly 100 has been soldered to printed circuit board 110 such as by vapor phase reflow soldering. Solder joint 120 firmly secures retention clip 10 to board 110. If proper conventional soldering procedures have been followed and enough solder paste 118 spread over enough area as described above, solder joint 120 will have large fillets 122 all along corners 28 where side clip sections 14 join to bottom clip section 12, and small fillets 124 will form around hole 18. Small fillets (not shown) will similarly form at axial end edges of bottom clip surface 12. It is preferred to have corners 28 to be more gently rounded as shown than sharply defined so as to assist the formation of large fillets 122 by assisting soldering paste 118 in wetting along the surface during the vapor phase reflow soldering of the solder to form joint 120.

It is also compatible to the method of the present invention to pre-cure the solder paste prior to positioning of the connector assembly to the board by placing the board under a heating step involving 200 degrees Fahrenheit to volatilize some of the vaporizable materials in the solder paste prior to the soldering. This pre-curing is conventionally performed and minimizes formation of voids within a finally soldered joint.

Figure 4:
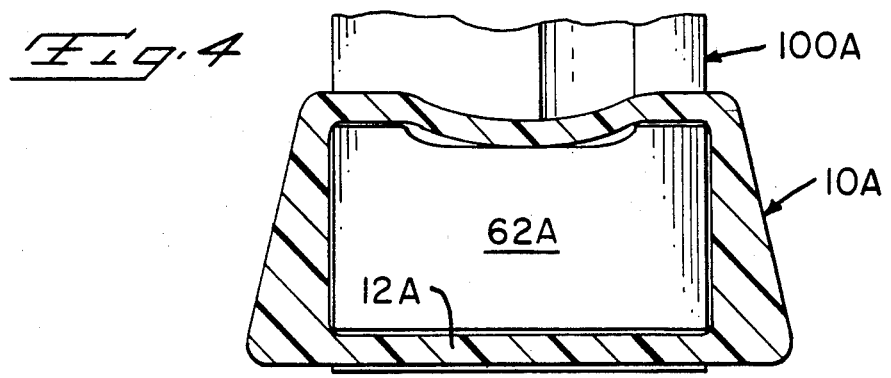
FIG. 4 illustrates a plastic retention clip to be bonded to a board using adhesive instead of solder.

In FIG. 4, a view similar to FIG. 3A shows an alternate retention clip 10A made of high-strength, heat-resistant plastic such as preferably RYTON R-4 (TM) 40 percent glass-filled polyethylene sulfide made by Phillips Chemical Co., Division of Phillips Petroleum Co. Such a plastic clip 10A should have a flat bottom surface 12A without a hole therethrough, for securing to a nonmetallic surface portion 126 of board surface 112 by adhesive material 128. Such adhesive material must have high strength and heat resistance and could be curable by actinic radiation (such as visible light, ultraviolet or infrared, for example), as is disclosed in U.S. Pat. Nos. 4,443,494 or 4,422,891, or in U.S. patent application Ser. No. 233,951 filed Feb. 17, 1981 now abandoned, referred to in said patents. During such securing step, it is preferred to avoid contacting and bonding of the adhesive with any portion of the connector assembly held by the clips. It is foreseeable that with a high strength bond under heat, and clips made of plastic having minimal deformation under in-surface temperatures of the board (such as 125 degrees Celsius), the terminal leg portions need not be soldered to conductive traces but held thereagainst by a spring-biasing thereof with sufficient contact force by the clips and their bonds. In such a case, the leg portions and conductive traces should be gold-plated to avoid corrosion. It is foreseeable to secure such a connector assembly 100A to the board 110A after all other soldering of components (such as by vapor phase reflow soldering) has been performed, to avoid subjecting the clips and bonds to the high temperatures (215 degrees Celsius) involved.

FIG. 5 shows a pair of retention clips 10 on end flanges 62 of a connector housing 60 secured to board surface 112, and illustrates the ability of the housing to be permitted limited movement in the axial or longitudinal direction to expand and contract while being held within clips 10 which remain stationary by reason of solder joints 120.

FIG. 6 is a cross section through a typical terminal-receiving cavity 70 in housing 60 showing a pin terminal 90 therein. Pin terminal 90 has a body section 96 disposed in cavity 70 but not press-fit therein, and a securing section 98 which holds terminal 90 in cavity 70. Securing section 98 is intermediate leg portion 92 and body section 96, and is disposed along reduced-size cavity section 80. With leg portion 92 soldered along its end portion at joint 130, slight movement of terminal 90 laterally is permitted to occur when housing 60 expands or contracts in its axial direction. Terminal body section 96 undergoes a slight rotation within cavity 70. Bottom housing surface 66 may have rib portions 82 extending between terminal leg portions 92 and having a small height serving as dielectric separator members for leg portions 92, as also shown in FIG. 2.

Figure 7:
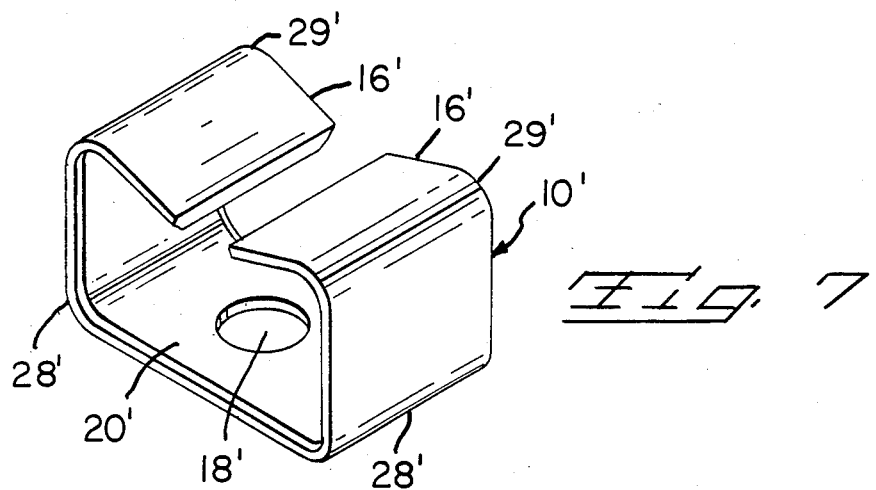
FIGS. 7 to 9 illustrate various embodiments of clips.

Four samples were made and tested of one embodiment of retention clip 10', shown in FIG. 7, made of phosphor bronze with tin plating and having relatively squared corners 24', downwardly extended arm sections 16', and a bottom surface having a net area of about 0.008 square inches exclusive of hole 18'. The clips were jointed to a plated metal board portion by a joint of solder comprising 60 percent tin to 40 percent lead formed by conventional vapor phase reflow soldering for about two minutes. A pair of solid wire loops on an INSTRON brand testing machine were placed through channel 20' proximate the outside corners 28' of the clip arm sections. When pulled, the solder joints of each clip survived pulling measured at about 44 pounds, but the arm sections opened upwardly releasing the wire loops.

To enhance the ability of clip arm sections to withstand a connector assembly being pulled upwardly during unmating of a corresponding mating connector, various means may be used, such as a latching extension of one arm extending across and latching downwardly securely in a slot in the other arm proximate its joint with its side section to prevent separation of the arms while allowing spring-biasing against a top flange surface 68, or by forming a short rib along each arm section extending inwardly from the side sections and partly along the side sections by stamping the metal blank with a die which work-hardens the arm section for strength.

Figure 8:
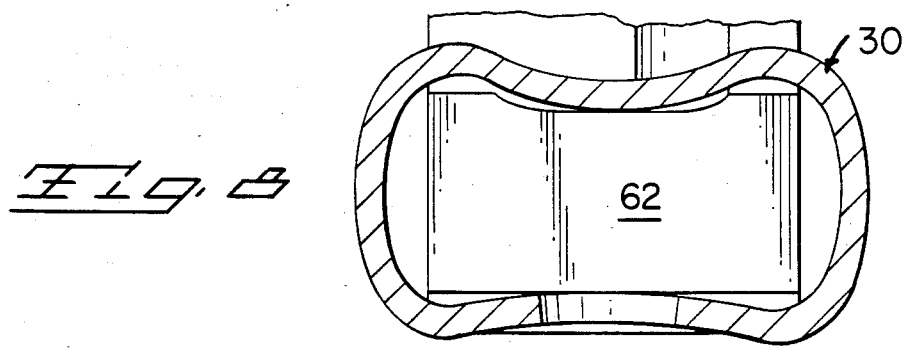

An alternative embodiment of retention clip could be a clip formed from a tube section having continuous circumference and formed into an appropriate shape by conventional forming techniques, if metal, or molding or extrusion, if plastic. FIG. 8 shows the preferred cross section of such a metal clip 30 which permits spring-biased engagement with a flange 62.

Figure 9:
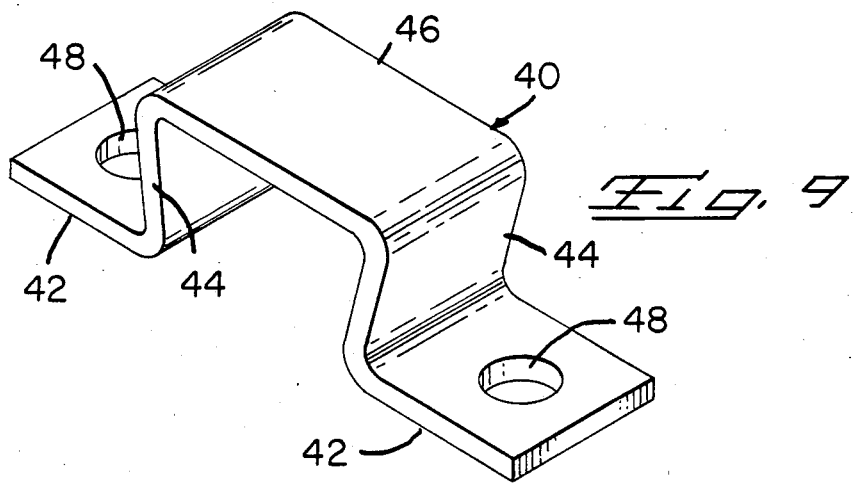

FIG. 9 shows another embodiment of retention clip 40 comprising board-engaging surface sections 42 extending laterally outwardly from outwardly directed side sections 44 which would engage flange side surfaces under spring bias, and having a continuous "arm" section 46 to extend over the top flange surface. Clip sections 42 of metal clips 40 would be soldered to a board at respective solder joints, and preferably have holes 48 through sections 42. Clips of plastic would be adhesively secured to the board and not have holes.

FIG. 10 illustrates a retention clip 50 capable of being secured to an intermediate housing portion 84 from one side thereof to be soldered to board 110. Clip 50 has one side section 52 and one long arm section 54 extending substantially across intermediate housing portion 84.

A retention clip of the present invention may also have an embodiment particularly useful in securing an appropriate connector assembly to an edge 204 of a printed circuit board 202. FIG. 11 shows a clip 210 for an edge connector 200. Clip 210 has one long board-proximate surface section 212, which also extends along a flange side surface 222 of a flange 220, and has an arm section 214 extending over top flange surface 224 and bends to have an end section 216 extend along the other flange side surface 226 and preferably is inwardly directed to engage flange 220 under spring bias. One such clip 210 can be placed on an end flange 220 with its board-proximate surface section 212 joined to area 207 on one board surface 206, as heretofore described, while a second clip can be placed on the other end flange and have its section 212 joined to area 209 (in phantom) on the opposite board surface 208, as heretofore described.

With any of the metal retention clips of the present invention it is possible to utilize the clips as a ground contact for a connector assembly which is shielded to minimize EMI interference, by soldering the clip to a ground conductor of the printed circuit board, and forming an electrical engagement between the shield of the connector and the retention clip.

Various modifications may be made to the retention clip of the present invention without departing from the scope of the claims or the spirit of the invention. Such a clip can have a surprisingly high retention force with appropriate solder material and soldering technique, or adhesive and bonding technique, while permitting limited axial connector movement due to thermal expansion and contraction.

What is claimed is:

1. A retention means for securing an electrical connector to a printed circuit board comprising a clip having a board-proximate surface section, at least one side section extending upward from a respective lateral edge of said board-proximate surface section, and a resilient arm section extending inward from each said side section substantially parallel to and opposed from said board-proximate surface section, the bottom surface of said board-proximate surface section of said clip being adapted to be firmly securable by a joint to a cooperating surface portion of said board and capable of holding a cooperating flange of a connector engagingly and axially movably therewithin.

2. A retention means as set forth in claim 1 wherein said clip is metallic and is solderable, said joint is a solder joint, and said cooperating board portion is plated metal.

3. A retention means as set forth in claim 2 wherein said clip is stamped and formed of metal having spring characteristics.

4. A retention means as set forth in claim 2 wherein at least the board-proximate surface section thereof is tin-lead-plated 5. A retention means as set forth in claim 2 wherein said clip has two said side sections and two respective resilient arm sections.

6. A retention means as set forth in claim 2 wherein a hole extends through said board-proximate surface section thereof.

7. A retention means as set forth in claim 2 wherein the edges of the inner surfaces of said board-proximate surface section, said at least one side section and said at least one resilient arm section are chamfered.

8. A retention means as set forth in claim 2 wherein each said side section is joined to said board-proximate surface section in rounded corners.

9. A retention means as set forth in claim 1 wherein said clip is a continuous sleeve-like member.

10. A retention means as set forth in claim 1 wherein said clip has an integral said arm section joining two said side sections, and said board-proximate surface section extends from at least one of said side sections.

11. A retention means as set forth in claim 10 wherein said board-proximate surface section comprises two portions each extending from a respective side section.

12. A retention means as set forth in claim 1 wherein said clip is plastic and is adherable, said joint is an adhesive bond, and said cooperating board portion is nonmetallic.

13. An electrical connector assembly for mounting to a surface portion of a printed circuit board comprising a connector housing having terminal-receiving cavities therethrough and longitudinally extending flanges on ends thereof proximate said surface portion of said board, terminals secured in said terminal-receiving cavities and including leg portions electrically engageable with respective conductors of said board surface, and at least two retention clips each disposed radially around a respective said flange on at least three sides thereof and having a board-proximate surface section means, and further having a flange-engaging means in spring engagement with a respective said flange such that said clip is springingly secured thereto, the board-proximate surface means of said board-proximate surface section means being adapted to be joined to said board surface portion and capable of permitting limited axial movement of said connector therewithin after said clips are secured to said board surface.

14. An electrical connector assembly as set forth in claim 13 wherein each said retention clip is metallic, said board-proximate surface section means is solderable, and said surface portion of said board is plated metal.

15. An electrical connector assembly as set forth in claim 14 wherein said flange-engaging section means of each said retention clip comprises at least one side section and a resilient arm section extending inwardly over a top of said flange from each said side section.

16. An electrical connector assembly as set forth in claim 15 wherein each said retention clip has two side sections and two resilient arm sections.

17. An electrical connector assembly as set forth in claim 14 wherein said retention clips have holes extending through said board-proximate surface section means thereof.

18. An electrical connector assembly as set forth in claim 14 wherein the edges of the inner surfaces of said board-proximate surface section means, said at least one side sections, and said at least one resilient arm sections are chamfered to facilitate placement on said connector flanges.

19. An electrical connector assembly as set forth in claim 14 further including at least a third retention clip engaging a respective portion of said connector housing intermediate the ends thereof.

20. An electrical connector assembly as set forth in claim 19 wherein at least said third retention clip has one said side section and a long said arm section extending therefrom.

21. An electrical connector assembly as set forth in claim 14 wherein said flange-engaging means is joined to said board-proximate surface section means at rounded corners.

22. An electrical connector assembly as set forth in claim 13 wherein said board surface portion is an edge surface and the board-proximate surface means of said board-proximate surface section means of at least one said retention clip is securable to a top surface of said board, and the board-proximate surface means of said board-proximate surface section means of at least the other said retention clip is securable to a bottom surface of said board.

23. An electrical connector assembly as set forth in claim 13 wherein a said retention clip is a continuous sleeve-like member.

24. An electrical connector assembly as set forth in claim 13 wherein said retention clip has an integral flange-engaging section extending across an outer surface of said flange, side sections extending downwardly from said flange-engaging section along side surfaces of said flange, and a board-proximate surface section extending parallel to said board surface outwardly from at least one of said side sections.

25. An electrical connector assembly as set forth in claim 13 wherein each said retention clip is plastic, said board-proximate surface section means is bondable by adhesive material, and said surface portion of said board is nonmetallic.

26. A method of securing an electrical connector to a surface of a printed circuit board comprising the steps of:
   securing retention clips radially around at least three sides of respective flanges at ends of said connector, said clips including board-proximate surface section means and connector-engaging section means, said securing being a spring engagement whereby said clips are axially and incrementally movable with respect to said connector;
   positioning said connector on said surface of said printed circuit board with terminals of said connector electrically engaging respective conductors of said board and the board-proximate surface means of said board-proximate surface section means of said retention clips engaging cooperating portions of said board surface; and
   joining at least said retention clips to said board surface by forming a joint between said board-proximate surface means and said cooperating board surface portions.

27. A method as set forth in claim 26 further comprising the step of soldering leg portions of said terminals to said conductors.

28. A method as set forth in claim 26 wherein said retention clips are metal and said joining step comprises soldering.

29. A method as set forth in claim 28 further comprising the step of soldering leg portions of said terminals to said conductors.

30. A method as set forth in claim 29 wherein said soldering of said retention clips and said soldering of said terminal leg portions are simultaneous.

31. A method as set forth in claim 28 wherein said soldering is vapor phase reflow soldering.

32. A method as set forth in claim 26 comprising the further step, prior to said positioning step, of securing another retention clip to a portion of the connector intermediate the ends thereof and joining said another retention clip to said board surface during said joining step.

33. A method as set forth in claim 26 wherein said retention clips are plastic, said joining step comprises bonding by adhesive material, and said cooperating portions of said board surface are nonmetallic.

34. An assembly of an electrical connector assembly mounted on a printed circuit board not requiring through-holes, comprising:
   a printed circuit board including at least two cooperating surface portions adjacent a contact-receiving surface portion having conductors thereon; and
   an electrical connector assembly comprising a connector housing having terminal-receiving cavities therethrough and longitudinally extending flanges on ends thereof associated with and proximate respective said cooperating board surface portions of said board, terminals secured in said terminal-receiving cavities and including leg portions electrically engaged with respective said conductors of said contact-receiving surface portion, and at least two retention clips each disposed radially around a respective and flange on at least three sides thereof and having a board-proximate surface section means, and further having a flange-engaging means in spring engagement with a respective said flange such that said clip is springingly secured thereto;
   said retention clips being joined to said board securing said connector assembly thereto, by joints formed between board-proximate surface means of said board-proximate surface section means of said clips and respective said cooperating board surface portions adjacent said contact-receiving board surface portion, said retention clips permitting limited axial movement of said connector housing therewithin after said clips are joined to said board.

* * * * *

UNITED STATES PATENT OFFICE
CERTIFICATE OF CORRECTION

Patent No. 4,629,278      Dated December 16, 1986

Inventor(s) Jeffrey M. Norton and Shoji Yamada

It is certified that error appears in the above-identified patent and that said Letters Patent are hereby corrected as shown below:

Column 10, claim 34, line 32, "and" should be ---said---.

Signed and Sealed this

Twenty-first Day of April, 1987

*Attest:*

DONALD J. QUIGG

*Attesting Officer*      *Commissioner of Patents and Trademarks*